(12) United States Patent
Eritt et al.

(10) Patent No.: US 12,207,482 B2
(45) Date of Patent: Jan. 21, 2025

(54) METHOD FOR ELECTRICALLY CONDUCTIVELY CONTACTING AN OPTOELECTRONIC COMPONENT HAVING AT LEAST ONE PROTECTIVE LAYER AND OPTOELECTRONIC COMPONENT HAVING A CONTACTING OF THIS TYPE

(71) Applicant: Heliatek GmbH, Dresden (DE)

(72) Inventors: Michael Eritt, Dresden (DE);
Christian Kirchhof, Dresden (DE);
Susanne Mueller, Dresden (DE);
Ingrid Panicke, Dresden (DE);
Christian Wisinger, Dresden (DE)

(73) Assignee: HELIATEK GMBH, Dresden (DE)

( * ) Notice: Subject to any disclaimer, the term of this patent is extended or adjusted under 35 U.S.C. 154(b) by 45 days.

(21) Appl. No.: 17/636,368

(22) PCT Filed: Aug. 18, 2020

(86) PCT No.: PCT/DE2020/100720
§ 371 (c)(1),
(2) Date: May 5, 2022

(87) PCT Pub. No.: WO2021/032250
PCT Pub. Date: Feb. 25, 2021

(65) Prior Publication Data
US 2022/0285641 A1 Sep. 8, 2022

(30) Foreign Application Priority Data
Aug. 19, 2019 (DE) ............ 10 2019 122 213.3

(51) Int. Cl.
*H10K 30/81* (2023.01)
*H10K 30/88* (2023.01)
*H10K 77/10* (2023.01)

(52) U.S. Cl.
CPC ............ *H10K 30/81* (2023.02); *H10K 30/88* (2023.02); *H10K 77/111* (2023.02)

(58) Field of Classification Search
CPC ...... H10K 30/81; H10K 30/88; H01L 31/048; H01L 31/0488; H01L 31/049;
(Continued)

(56) References Cited

U.S. PATENT DOCUMENTS

| | | | | |
|---|---|---|---|---|
| 4,431,891 A | * | 2/1984 | Forstner | B23K 1/002 219/616 |
| 4,443,652 A | * | 4/1984 | Izu | H01L 31/0201 136/258 |
| 4,685,608 A | * | 8/1987 | Kujas | H01L 31/0504 219/649 |

(Continued)

FOREIGN PATENT DOCUMENTS

| | | |
|---|---|---|
| DE | 102007052972 A1 | 5/2009 |
| EP | 2618381 A1 | 7/2013 |
| JP | 2015154049 A | 8/2015 |
| WO | WO 2009/132468 A1 | 11/2009 |
| WO | WO 2015/024927 A1 | 2/2015 |

OTHER PUBLICATIONS

WO 2015/024927 English machine translation (Year: 2015).*
Ambrell Induction Heating Solutions "Improved Soldering with Induction Heating", 2020 (Year: 2020).*

*Primary Examiner* — Andrew J Golden
(74) *Attorney, Agent, or Firm* — LEYDIG, VOIT & MAYER, LTD.

(57) ABSTRACT

A method for electrically conductively contacting an optoelectronic component having at least one protective layer, including: providing the optoelectronic component having the at least one protective layer with at least one busbar arranged below the at least one protective layer, forming at least one opening by at least one laser beam in the at least one protective layer, wherein at least one busbar arranged below the at least one protective layer is partly exposed, such that the at least one busbar is not damaged, introducing a low-melting solder into the at least one opening of the at (Continued)

least one protective layer, aligning and fixing an electrically conductive element that is flexible on a side of the at least one opening opposite the at least one busbar, and forming an electrically conductive connection element in the at least one opening.

18 Claims, 4 Drawing Sheets

(58) Field of Classification Search
CPC ....... H01L 31/05–0508; H01L 31/0445–0468; H02S 40/34; H02S 40/36
See application file for complete search history.

(56) References Cited

U.S. PATENT DOCUMENTS

| | | |
|---|---|---|
| 2010/0294347 A1 | 11/2010 | Zimmer et al. |
| 2011/0111534 A1 | 5/2011 | Guedel et al. |
| 2011/0308562 A1 | 12/2011 | Shufflebotham |
| 2012/0152349 A1* | 6/2012 | Cao .................. H02S 40/34 438/66 |
| 2012/0228275 A1* | 9/2012 | Heinrici .............. H02S 40/34 219/121.72 |
| 2014/0060622 A1* | 3/2014 | Clark .................. H02S 40/34 136/251 |
| 2017/0077343 A1* | 3/2017 | Morad ................ H01L 31/048 |

* cited by examiner

METHOD FOR ELECTRICALLY CONDUCTIVELY CONTACTING AN OPTOELECTRONIC COMPONENT HAVING AT LEAST ONE PROTECTIVE LAYER AND OPTOELECTRONIC COMPONENT HAVING A CONTACTING OF THIS TYPE

CROSS-REFERENCE TO PRIOR APPLICATIONS

This application is a U.S. National Phase application under 35 U.S.C. § 371 of International Application No. PCT/DE2020/100720, filed on Aug. 18, 2020, and claims benefit to German Patent Application No. DE 10 2019 122 213.3, filed on Aug. 19, 2019. The International Application was published in German on Feb. 25, 2021 as WO 2021/032250 A1 under PCT Article 21(2).

FIELD

The invention relates to a method for electrically conductively contacting an optoelectronic component having at least one protective layer, and to an optoelectronic component having a contacting of this type.

BACKGROUND

Optoelectronics is composed of the field of optics and semiconductor electronics. It encompasses in particular systems and methods which enable electronically generated energies to be converted into light emission or convert light emissions into energy. Optoelectronic components, in particular organic photovoltaic elements (OPVs) and organic light emitting diodes (OLEDs), generate electrical energy or convert electrical energy into light emissions, which for application purposes thereafter has to be led out of the photovoltaic element or led in. That requires busbars, as they are called, which have to satisfy the requirements of a flexible photovoltaic element.

Busbars constitute a point in an optoelectronic component at which the converted energy is concentrated and passed on in the form of electric currents. In the field of photovoltaic elements, busbars are known which are applied on the front side or on the back side of the photovoltaic elements. The dimensions of the cross section of a busbar depend on the current intensity to be transmitted. For protection against external influences, however, photovoltaic elements are generally provided or encapsulated with a protective layer, in particular in order to protect them mechanically and against environmental influences, for example moisture or diffusion of oxygen. The busbars are arranged below the protective layer. In order to lead out generated electrical energy from photovoltaic elements through the protective layer, the busbars lying within the protective layer have to be electrically conductively contacted through the protective layer.

WO2009/13468A1 discloses a method for contacting optoelectronic components, wherein the contacting is carried out by means of drilling or milling. In this case, after complete lamination of the optoelectronic component, a specific region of the lamination layer is completely pierced or removed, and the exposed contacting region is contacted by means of a connecting element that can be tapped externally.

DE102007052972A1 discloses a method for connecting thin metal layers on polymeric carriers, for example solar cells, using a laser beam for opening a polymer layer and subsequently riveting the thin metal layers in order to connect the metal layers. In the method, a laser is used with varying energy and temporal control of the applied laser energy for introducing the opening into the polymer carrier film and riveting the thin metal layers.

JP2015154049A discloses a flexible thin-film solar cell having a protective layer on the front side and a protective layer on the back side of the solar cell, having a connecting element and a connecting connection that is connected to the connecting element. The connecting connection is connected to a connecting terminal arranged on a side surface of the solar cell for the purpose of withdrawing the electric current, the connecting terminal having a smaller thickness in comparison with the layer thickness of the solar cell.

US20110308562A1 discloses a junction box for photovoltaic elements having a protective layer, wherein the junction box has contact points which are configured to pierce a protective layer, and thereby form an electrically conductive contacting with the photovoltaic element having the protective layer.

What is disadvantageous about the prior art, however, is that known methods for electrically conductively contacting of optoelectronic components having at least one protective layer adversely affect the function of the protective layer and/or at least partly damage underlying elements. Furthermore, the known methods are in particular not suitable for a roll-to-roll process for producing photovoltaic elements.

SUMMARY

In an embodiment, the present invention provides a method for electrically conductively contacting an optoelectronic component having at least one protective layer, comprising: a) providing the optoelectronic component having the at least one protective layer, wherein the optoelectronic component has at least one busbar arranged below the at least one protective layer, b) forming at least one opening by laser ablation using at least one laser beam in the at least one protective layer, wherein the wavelength range of the laser is 8 µm to 12 µm, wherein at least one busbar arranged below the at least one protective layer is partly exposed, such that the at least one busbar is not damaged, c) introducing a low-melting solder into the at least one opening of the at least one protective layer, and aligning and fixing an electrically conductive element that is flexible on a side of the at least one opening opposite the at least one busbar, and d) forming, by inductive soldering with a uniform heat input, an electrically conductive connection element in the at least one opening, such that the electrically conductive element and the at least one busbar are electrically conductively contacted via the at least one connection element.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
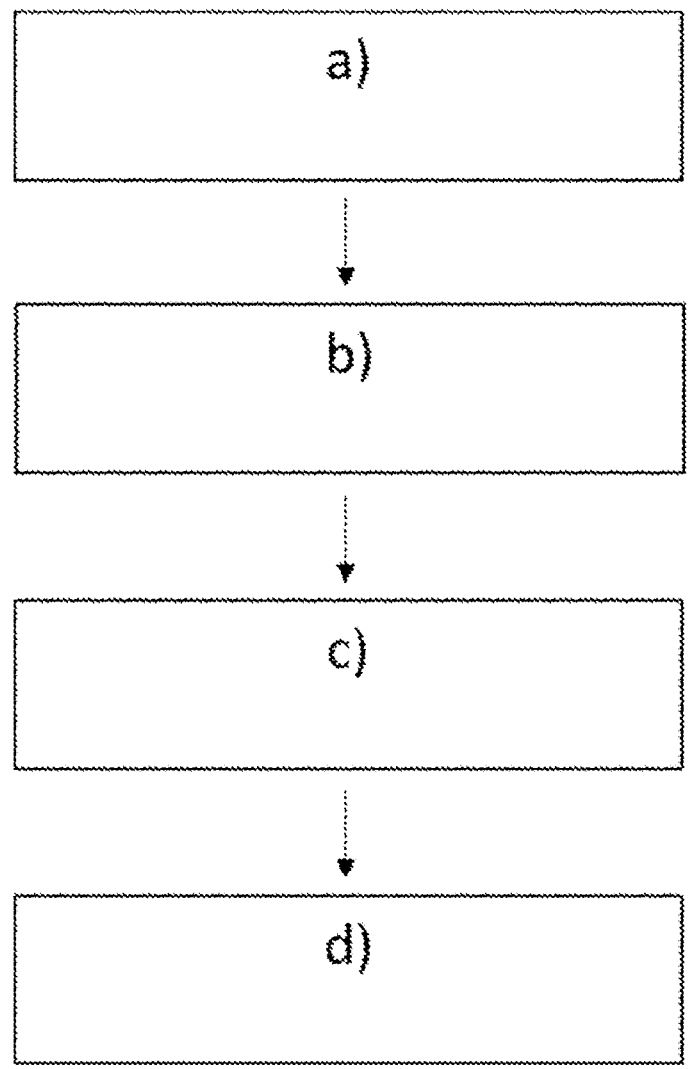
FIG. 1 shows a schematic illustration of one exemplary embodiment of a method for electrically conductively contacting an optoelectronic component having at least one protective layer, in a flow diagram.

Embodiments of the invention therefore provide a method for electrically conductively contacting an optoelectronic component having at least one protective layer wherein the disadvantages mentioned do not occur, and wherein in particular a simple and reliable electrical contacting of an optoelectronic component having at least one protective layer is provided, in particular in a roll-to-roll process, wherein in particular the function of the at least one protective layer and/or of elements arranged underneath is not adversely affected, with these in particular not being damaged.

In an embodiment, the method comprises the following method steps:
a) providing the optoelectronic component having the at least one protective layer, wherein the optoelectronic component has at least one busbar arranged below the at least one protective layer,
b) forming at least one opening by means of laser ablation using at least one laser beam in the at least one protective layer, wherein the wavelength range of the laser is 8 µm to 12 µm, wherein at least one busbar arranged below the at least one protective layer is partly exposed, such that the at least one busbar is not damaged,
c) introducing a low-melting solder into the at least one opening of the at least one protective layer, and aligning and fixing a flexible electrically conductive element on a side of the at least one opening opposite the at least one busbar, and
d) forming, by means of inductive soldering with a uniform heat input, at least one electrically conductive connection element in the at least one opening, such that the electrically conductive element and the at least one busbar are electrically conductively contacted via the at least one connection element.

In one preferred embodiment, after step d) the electrically conductive element is at least regionally outwardly coated with an insulating layer.

In one preferred embodiment, the at least one opening is formed by means of laser ablation in the protective layer in such a way that an electrically conductive contacting of the busbar with the electrically conductive element is possible.

In one preferred embodiment, in order to form the at least one opening by means of laser ablation in step b), parameters, preferably an energy density, a pulse duration, a pulse shape, a pulse frequency and/or a wavelength of the at least one laser beam, are adapted depending on the material and the layer thickness of the at least one protective layer.

In one preferred embodiment, a continuous laser is used. In one alternatively preferred embodiment, a pulsed laser is used. In one preferred embodiment, the pulse duration of the laser in step b) is less than 60 µs, preferably less than 40 µs, preferably less than 20 µs, preferably less than 10 µs, preferably less than 8 µs, preferably less than 6 µs, or preferably less than 4 µs.

In one preferred embodiment, the wavelength range of the laser in step b) is 8 µm to 12 µm, preferably 9 µm to 12 µm, preferably 10 µm to 12 µm, preferably 11 µm to 12 µm, preferably 8 µm to 11 µm, preferably 8 µm to 10 µm, preferably 8 µm to 9 µm, preferably 9 µm to 11 µm, preferably 9 µm to 10 µm, or preferably 10 µm to 11 µm.

In one preferred embodiment, in order to form the connection element by means of inductive soldering in step d), parameters are adapted depending on the material and the dimensions of the connection element to be formed, such that the inductive soldering ensures the formation of the connection element for electrically conductively contacting the at least one busbar and the electrically conductive element, and in the process does not damage the at least one busbar and the layer system.

In one preferred embodiment, evaporated material is extracted by suction during the laser ablation in step b) and/or during the inductive soldering in step d).

In one preferred embodiment, an energy density of the at least one laser beam in the case of the laser ablation in step b) is adapted during the ablation depending on a removal depth of the at least one protective layer.

In one preferred embodiment, the cycle time of the laser ablation in step b) is less than 4 s, preferably less than 2 s, and/or the cycle time of the inductive soldering in step d) is less than 10 s, preferably less than 4 s.

In one preferred embodiment, in step b) the at least one opening is introduced into the at least one protective layer on a side of the optoelectronic component, preferably of a solar cell, that faces away from the sun as intended.

A busbar, as it is called, is understood to mean in particular an arrangement which, for the purpose of electrical contacting as a central distributor of electrical energy, is electrically conductively connected to incoming and outgoing lines, preferably with at least one electrode and/or at least one counterelectrode. The busbar is embodied in particular in planar fashion as a ribbon, a strip, a plate or as a metal layer.

In one preferred embodiment, the at least one busbar has a layer thickness of 10 µm to 500 µm, preferably of 100 µm to 500 µm, preferably of 10 µm to 200 µm, preferably of 10 µm to 100 µm, preferably of 10 µm to 50 µm, or preferably of 20 µm to 40 µm.

In one preferred embodiment, the at least one busbar has a low absorptivity for heat and/or a high reflection of the wavelength of the at least one laser beam, such that the at least one busbar is only slightly heated during the laser ablation in step b).

An optoelectronic component is understood to mean in particular a photovoltaic element.

A photovoltaic element is understood to mean in particular a photovoltaic cell, in particular a solar cell. The photovoltaic element is preferably constructed from a plurality of photovoltaic cells which can be interconnected in series or in parallel. The plurality of photovoltaic cells can be arranged and/or interconnected in various ways in the optoelectronic component.

In one preferred embodiment, the optoelectronic component, in particular the photovoltaic element, comprises at least one electrode, a counterelectrode, and a layer system having at least one photoactive layer, wherein the layer system is arranged between the two electrodes and wherein the at least one busbar is electrically conductively contacted at least partly at the electrode and/or the counterelectrode.

In one preferred embodiment, the electrode, the layer system and the counterelectrode are laser-structured, such that the electrode and/or the counterelectrode are/is electrically conductively contactable with the at least one busbar in each case from a side of the optoelectronic component facing away from the sun as intended or in each case from a side of said optoelectronic component facing the sun as intended. This enables in particular the electrically conductive contacting of different potentials on one plane of the optoelectronic component, in particular a plane parallel to the extent of the laser system via at least one busbar.

In one preferred embodiment, two busbars are arranged at the electrode and/or the counterelectrode, wherein a first busbar is assigned to a first potential and a second busbar is assigned to a second potential.

In one preferred embodiment, the optoelectronic component is a flexible optoelectronic component. In one preferred embodiment, the flexible optoelectronic component is a flexible photovoltaic element, in particular a flexible organic photovoltaic element.

A flexible optoelectronic component is understood to mean in particular an optoelectronic component which is bendable and/or extensible in a specific region.

In one preferred embodiment, the photovoltaic element comprises a cell having at least one photoactive layer, in particular a CIS, CIGS, GaAs, or Si cell, a perovskite cell or an organic photovoltaic element (OPV), a so-called organic solar cell. An organic photovoltaic element is understood to mean in particular a photovoltaic element having at least one organic photoactive layer, in particular a polymeric organic photovoltaic element or an organic photovoltaic element based on small molecules. While polymers are distinguished by the fact that they are not evaporable and can therefore be applied only from solutions, small molecules are usually evaporable and can be applied either as a solution like polymers, but also by means of evaporation technology, in particular by evaporation from a vacuum. Particularly preferably, the photovoltaic element is a flexible organic photovoltaic element based on small molecules.

In one preferred embodiment, the photoactive layer of the layer system comprises small molecules which are evaporable in a vacuum. In one preferred embodiment, at least the photoactive layer of the layer system is applied by vapor deposition in a vacuum.

Small molecules are understood to mean in particular non-polymeric organic molecules having monodisperse molar masses of between 100 and 2000 g/mol, which are present in a solid phase under standard pressure (air pressure of the atmosphere surrounding us) and at room temperature. In particular, the small molecules are photoactive, where photoactive is understood to mean that the molecules change their state of charge and/or their polarization state when subjected to light incidence.

A protective layer is understood to mean in particular a barrier layer for preventing the possible passage of external influences, in particular atmospheric oxygen and/or moisture, a protective layer for increasing the mechanical durability, in particular scratch resistance, and/or a filter layer, preferably a layer with a UV filter.

An element arranged below a protective layer is understood to mean in particular an element that is arranged at the protective layer in such a way that the protective layer protects it against external influences.

In one preferred embodiment, the optoelectronic component has at least one protective layer on the front side and at least one protective layer on the back side of the optoelectronic component. In one preferred embodiment, at least one of the at least one protective layer of the front side is adhesively bonded to one of the at least one protective layer of the back side.

A front side of an optoelectronic component is understood to mean in particular a side of the optoelectronic component facing the sun as intended. Accordingly, a back side of an optoelectronic component is understood to mean in particular a side of the optoelectronic component facing away from the sun as intended.

In one preferred embodiment, the optoelectronic component has an encapsulation composed of at least one protective layer, which diffusion-tightly encloses, i.e. seals, the optoelectronic component. In one preferred embodiment, the encapsulation is a polymer encapsulation.

In one preferred embodiment, the optoelectronic component is electrically conductively contacted with the electrically conductive element from the side facing away from the sun as intended.

In one preferred embodiment, the electrically conductive element is arranged directly onto the at least one protective layer. In one alternatively preferred embodiment, the electrically conductive element is arranged onto an electrically conductive connection layer applied on the at least one protective layer.

In one preferred embodiment, the electrically conductive element is embodied as a cross-connector.

In one preferred embodiment, between the at least one protective layer and the electrically conductive element there is arranged at least partly a functional layer, preferably a color layer, a filter layer and/or an adhesive layer. In one preferred embodiment, the functional layer is applied to the at least one protective layer by means of a roll-to-roll process.

In one preferred embodiment, in step c) and/or d) the flexible electrically conductive element is fixed on a side of the at least one opening opposite the at least one busbar.

In one preferred embodiment, in step c) the flexible electrically conductive element is fixed on a side of the at least one opening opposite the at least one busbar by means of a fixing tape, preferably an adhesive tape.

In one preferred embodiment, in step c) and/or d) the electrically conductive element is fixed on a side of the at least one opening opposite the at least one busbar by application of pressure.

In one preferred embodiment, a connection material, in particular an adhesive, is applied between the at least one busbar and the at least one protective layer, wherein preferably the at least one protective layer and the at least one busbar are connected in a positively locking manner. In one preferred embodiment, the connection material is at least substantially transmissive to visible light.

In one preferred embodiment, the optoelectronic component has two protective layers arranged one above the other, preferably three protective layers arranged one above another, or preferably four protective layers arranged one above another. In one preferred embodiment, at least one connection material, in particular an adhesive, is arranged between the protective layers, wherein the type of the at least one connection material can differ between the individual protective layers.

In one preferred embodiment, the at least one protective layer is embodied from a film or a coating, preferably composed of a lacquer or a polymer.

In one preferred embodiment, the at least one protective layer is embodied from at least one front side film and at least one back side film of the optoelectronic component. In one preferred embodiment, the at least one protective layer is embodied as an encapsulation.

In one preferred embodiment, the at least one busbar is covered by the at least one protective layer, such that the at least one busbar does not extend beyond the protective layer, and is thus not electrically contactable via cables outside the at least one protective layer.

In association with the present invention, a uniform heat input is understood to mean in particular a soldering location that is heated uniformly from all sides during inductive soldering, in particular in order to attain as equal a temperature distribution as possible in the soldering location.

In association with the present invention, a low-melting solder is understood to mean in particular a solder that melts below a specific temperature at which at least the electrode and the layer system of the optoelectronic component are not damaged; preferably, the low-melting solder is soldered without flux.

The method according to an embodiment of the invention for electrically conductively contacting an optoelectronic component having at least one protective layer has advantages in comparison with the prior art. Advantageously, a simple and reliable electrically conductive contacting of the optoelectronic component is ensured. Advantageously, damage to the layer system and/or the electrodes is avoided. Advantageously, the heat input is limited temporally as well as thermally, thereby avoiding damage to the adjoining layer system. Advantageously, the busbars, in particular the busbars embodied as thin metal layers, and the electrically conductive connection material arranged between the electrode and/or the counterelectrode and the at least one busbar are not damaged. Advantageously, the diffusion tightness of the at least one protective layer is not reduced. Advantageously, the method is particularly cost-effective. Advantageously, the method is able to be carried out in a roll-to-roll process. Advantageously, mechanical stresses between the at least one busbar and the electrically conductive element and hence instances of cracking are avoided by virtue of a non-contact and uniform heat input. Advantageously, no cable is required for electrically conductively contacting the at least one busbar to the junction box. Advantageously, a plurality of busbars, in particular a plurality of connection elements, can be connected via an electrically conductive contacting. Advantageously, only one junction box is required for electrically conductively contacting the optoelectronic component. Advantageously, a precise repetition accuracy and a high degree of automation with short cycle times are possible. Advantageously, a junction box can easily be integrated at different regions of the optoelectronic component. Advantageously, the number of potential weak points in the case of the integration of the junction box is reduced. Advantageously, the photovoltaic element, with such a contacting, is able to be secured to a surface in a positively locking manner.

According to one embodiment of the invention, it is provided that after step d) the at least one electrically conductive element is electrically conductively connected to a junction box, wherein the junction box is arranged on the optoelectronic component, preferably on a region at a distance from a corner of the optoelectronic component.

In one preferred embodiment, the junction box is arranged directly on the surface of the optoelectronic component.

In one preferred embodiment, the junction box is arranged at an edge of the at least one protective layer and/or the encapsulation of the optoelectronic component. In one preferred embodiment, the junction box is adhesively bonded to the surface of the optoelectronic component.

A junction box is understood to mean in particular an element for connecting the optoelectronic component to an electrical circuit. The junction box serves in particular for electrically conductively connecting at least one busbar arranged below the at least one protective layer of the optoelectronic component to an electrical circuit.

In one preferred embodiment, the junction box is arranged on a region of the optoelectronic component without a layer system, in particular without a photoactive layer. Degradation processes of the photoactive layer are avoided as a result.

According to one embodiment of the invention, it is provided that the laser medium of the at least one laser beam in step b) is $CO_2$.

According to one embodiment of the invention, it is provided that in step c) a solder preform is introduced into the at least one opening. In one preferred embodiment, the solder preform is formed from the low-melting solder.

According to one embodiment of the invention, it is provided that the at least one opening has a cross-sectional area of 0.1 to 75 mm2, preferably of 1 to 30 mm2, wherein preferably a contact area of the connection element with the at least one busbar and/or with the electrically conductive element is smaller than the area of the busbar facing the connection element.

In one preferred embodiment, the at least one opening has a cross-sectional area of 0.1 to 75 mm2, preferably of 0.1 to 30 mm2, preferably of 1 to 75 mm2, preferably of 1 to 30 mm2, preferably of 1 to 10 mm2, preferably of 0.1 to 10 mm2, preferably of 20 to 50 mm2, or preferably of 10 to 30 mm2.

In one preferred embodiment, the opening is formed in a circular shape, but in one alternatively preferred embodiment the opening can be formed in a different polygonal shape, or in an elliptic shape, in particular a square, triangular, hexagonal or octagonal shape.

In one preferred embodiment, the at least one opening has a diameter of 10 μm to 5 mm, preferably of 100 μm to 5 mm, 1 mm to 5 mm, preferably of 1 mm to 2 mm, preferably of 10 μm to 1 mm, preferably of 100 μm to 1 mm, or preferably of 10 μm to 100 μm.

In one preferred embodiment, the connection element has a cross-sectional area of 0.1 to 75 mm2, preferably of 0.1 to 30 mm2, preferably of 1 to 75 mm2, preferably of 1 to 30 mm2, preferably of 1 to 10 mm2, preferably of 0.1 to 10 mm2, preferably of 20 to 50 mm2, or preferably of 10 to 30 mm2.

In one preferred embodiment, the connection element is formed in a circular shape, but in one alternatively preferred embodiment the opening can be formed in a different polygonal shape, or in an elliptic shape, in particular a square, triangular, hexagonal or octagonal shape.

In one preferred embodiment, the connection element has a diameter of 10 μm to 5 mm, preferably of 100 μm to 5 mm, preferably of 1 mm to 5 mm, preferably of 1 mm to 2 mm, preferably of 10 μm to 1 mm, preferably of 100 μm to 1 mm, or preferably of 10 μm to 100 μm.

In one preferred embodiment, the cross-sectional area of the at least one opening at least substantially corresponds to the cross-sectional area of the connection element.

According to one embodiment of the invention, it is provided that the low-melting solder for forming the connection element is selected from the group consisting of bismuth, copper, silver and tin, and an alloy of at least one of these elements.

In one particularly preferred embodiment, the low-melting solder for forming the connection element is formed from tin and bismuth or an alloy thereof, preferably from tin, bismuth, copper and silver. In one preferred embodiment, the low-melting solder has contaminants of further elements in an amount of a maximum of 5% by weight, preferably a maximum of 2% by weight.

In one preferred embodiment, the at least one protective layer is embodied from a film, in particular a light-transmissive film. In one preferred embodiment, the at least one protective layer is embodied from ethylene tetrafluoroethylene (ETFE), ethylene vinylacetate (EVA), polycarbonate (PC), polyethylene (PE), polyethylene naphthalate (PEN), polyethylene terephthalate (PET), polymethyl methacrylate (PMMA), polypropylene (PP), or thermoplastic polyurethane (TPU).

According to one embodiment of the invention, it is provided that at least one connection material, preferably an adhesive, is arranged between the at least one protective layer and the at least one busbar, wherein in step b) the at least one opening is formed in the at least one protective layer and in the connection material arranged on the at least one protective layer.

In one preferred embodiment, the connection material is connected to the at least one protective layer and/or at the least one busbar in a positively locking manner. In one preferred embodiment, the connection material is an at least substantially light-transmissive adhesive.

In one preferred embodiment, the electrically conductive contacting of the at least one busbar with the electrically conductive element and of the electrically conductive element with the junction box is carried out without cables. In one alternatively preferred embodiment, the electrically conductive contacting of the electrically conductive element with the junction box is carried out via at least one cable.

In one preferred embodiment, the at least one protective layer has a layer thickness of 10 µm to 500 µm, preferably of 100 µm to 500 µm, preferably of 10 µm to 100 µm, preferably of 10 µm to 50 µm, or preferably of 20 µm to 40 µm.

According to one embodiment of the invention, it is provided that the electrically conductive element is embodied as a plate or a strip, wherein the plate or the strip preferably has a layer thickness of 10 µm to 100 µm, preferably of 10 µm to 60 µm, or is embodied as a wire, wherein the wire preferably has a cross-sectional area of 0.1 mm2 to 2 mm2 preferably of 0.5 mm2 to 1 mm2.

In one preferred embodiment, the electrically conductive element has a layer thickness of 10 µm to 500 µm, of 10 µm to 200 µm, preferably of 100 µm to 200 µm, preferably of 10 µm to 100 µm, preferably of 10 µm to 60 µm, or preferably of 20 µm to 40 µm.

In one preferred embodiment, the electrically conductive element has a cross-sectional area of 0.1 mm2 to 2 mm2, preferably 0.1 mm2 to 1.5 mm2, preferably of 0.2 mm2 to 1.5 mm2, preferably of 0.5 mm2 to 1.5 mm2, preferably of 0.2 mm2 to 1 mm2, or preferably of 0.5 mm2 to 1 mm2.

According to one embodiment of the invention, it is provided that the at least one busbar is embodied as a metal layer composed of at least one metal or an alloy thereof, preferably composed of copper and tin, wherein preferably the at least one busbar and the electrically conductive element are embodied from the same material.

In one preferred embodiment, the at least one busbar is cohesively connected to the connection element and/or the electrically conductive element is cohesively connected to the connection element.

In one preferred embodiment, after the inductive soldering in step d), a sealing material is applied in and/or on the opening having the connection element, such that the at least one opening with the connection element is sealed.

According to one embodiment of the invention, it is provided that after step d) the at least one electrically conductive element is electrically conductively connected to a junction box, wherein the junction box is arranged on the optoelectronic component.

In one preferred embodiment, for the purpose of electrically conductively connecting the junction box to the electrically conductive element of the optoelectronic component having at least one protective layer after step d) in a step e) at least one connecting opening is formed by means of laser ablation using at least one laser beam in the at least one protective layer, preferably from that side of the optoelectronic component having the at least one protective layer which faces the sun as intended, with the electrically conductive element obtained in step d), wherein the wavelength range of the laser is 8 µm to 12 µm, wherein the electrically conductive element arranged behind the at least one protective layer on the side facing away from the sun as intended is at least partly exposed, such that the electrically conductive element is not damaged.

In one alternatively preferred embodiment, in step e) the at least one connecting opening is introduced into an insulating layer of the electrically conductive element on a side of the optoelectronic component, preferably of a solar cell, facing away from the sun as intended.

The implementation of the laser ablation in step e) with the associated parameters substantially corresponds to that in step b).

In one preferred embodiment, for the purpose of forming the at least one connecting opening by means of laser ablation in step e), parameters, preferably an energy density, a pulse duration, a pulse shape, a pulse frequency and/or a wavelength of the at least one laser beam, are adapted depending on the material and the layer thickness of the at least one protective layer.

In one preferred embodiment, the laser medium of the at least one laser beam in step e) is $CO_2$.

In one preferred embodiment, the at least one connecting opening has a cross-sectional area of 0.1 to 75 mm2, preferably of 1 to 40 mm2, or preferably of 1 to 30 mm2.

In one preferred embodiment, in a step f) a solder is introduced into the at least one connecting opening of the at least one protective layer formed in step e), and the junction box is aligned and fixed on a side of the at least one connecting opening opposite the electrically conductive element, and in a step g) by means of inductive soldering an electrically conductive connecting element is formed in the at least one connecting opening, such that the electrically conductive element and the junction box are electrically conductively contacted via the at least one connecting element.

In one preferred embodiment, the junction box is fixed on a side of the at least one connecting opening opposite the electrically conductive element in step f) and/or step g).

In one preferred embodiment, in step e) the at least one connecting opening is introduced into the at least one protective layer on a side of the optoelectronic component, preferably of a solar cell, facing the sun as intended.

In one preferred embodiment, for the purpose of forming the connecting element by means of inductive soldering in step g), parameters are adapted depending on the material and the dimensions of the connecting element to be formed.

In one preferred embodiment, in step f) a solder preform is introduced into the at least one opening. In one preferred embodiment, the junction box has the solder preform. In one alternatively preferred embodiment, the junction box, in particular connecting lines of the junction box, is cohesively connected to the connecting element in step g).

In one preferred embodiment, the connecting element has a cross-sectional area of 0.1 to 75 mm2, preferably of 1 to 40 mm2, or preferably of 1 to 30 mm2.

In one preferred embodiment, the solder for forming the connecting element is selected from the group consisting of bismuth, copper, silver and tin, and an alloy of at least one of these elements.

In one preferred embodiment, the electrically conductive element and the junction box are electrically conductively contacted directly via the connecting element, wherein in particular no additional cable is arranged between the electrically conductive element and the junction box for the purpose of electrically conductive contacting.

In one preferred embodiment, after the inductive soldering in step g) a sealing material is applied and/or introduced in and/or on the connecting opening having the connecting element, such that the at least one connecting opening with the connecting element is sealed; preferably, the sealing material is a silicone and/or a resin.

In one alternatively preferred embodiment, the junction box is electrically conductively connected to the electrically conductive element by means of a plug connection. As a result, the junction box can be installed particularly easily reversibly at the optoelectronic component, in particular at the location of the installation of the optoelectronic component.

In one preferred embodiment, the junction box has a diode.

Organic photovoltaic elements, in particular organic solar cells, consist of a sequence of thin layers comprising at least one photoactive layer, which preferably are applied by vapor deposition in a vacuum or are processed from a solution. The electrical linking can be effected by means of metal layers, transparent conductive oxides and/or transparent conductive polymers. The vacuum vapor deposition of the organic layers is advantageous in particular in the production of multilayered solar cells, in particular tandem or triple cells.

In one preferred embodiment, the photovoltaic element, in particular the organic photovoltaic element, is embodied from at least one cell. In one preferred embodiment, the cell is a single, tandem or multiple cell. Tandem and multiple cells consist of at least two cells arranged one above another between the electrodes, wherein each cell has at least one photoactive layer.

In one preferred embodiment, a plurality of cells of the photovoltaic element are arranged as strips with contacts next to one another and are interconnected in series. Preferably, in this case, each cell has its own electrode and counterelectrode. The series connection is effected by the electrode of one cell being electrically connected to the counterelectrode of the next cell.

In one preferred embodiment, the optoelectronic component is provided with additionally a barrier layer and/or is additionally encapsulated with a barrier layer in order to minimize a degradation as a result of external influences.

According to one embodiment of the invention, it is provided that the method for electrically conductively contacting an optoelectronic component is used in a roll-to-roll process.

In an embodiment, an optoelectronic component, in particular a flexible optoelectronic component, having at least one protective layer and having at least one busbar arranged below the at least one protective layer of the optoelectronic component, preferably produced according to a method according to the invention, in particular according to one of the exemplary embodiments described above. In this case, the optoelectronic component has at least one electrically conductive contacting, wherein the at least one electrically conductive contacting electrically conductively contacts the at least one busbar to a flexible electrically conductive element by means of an electrically conductive connection element, and wherein the optoelectronic component is preferably connected to a junction box. In this case, in particular the advantages that have already been described in association with the method for electrically conductively contacting an optoelectronic component having at least one protective layer are afforded for the optoelectronic component.

In one preferred embodiment, the electrically conductive element is arranged directly on the at least one protective layer. In one alternatively preferred embodiment, the electrically conductive element is arranged onto a connection layer applied on the at least one protective layer.

In one preferred embodiment, the at least one busbar is arranged on an electrode or a counterelectrode. In one preferred embodiment, the at least one busbar is arranged on a side of the optoelectronic component, in particular of a photovoltaic element, facing away from the sun as intended.

In one preferred embodiment, the at least one busbar is arranged at least substantially over the width or length of the layer system which leads the two poles, comprising the negative and positive poles, of the photovoltaic element to a junction point.

In one preferred embodiment, the at least one busbar is applied directly to the electrode or the counterelectrode. In one alternatively preferred embodiment, an electrically conductive layer is arranged between the at least one busbar and the electrode or the counterelectrode.

According to one embodiment of the invention, it is provided that at least one connection material, preferably an adhesive, is arranged between the at least one protective layer and the at least one busbar, wherein the at least one opening is formed in the at least one protective layer and in the connection material arranged on the at least one protective layer. In one preferred embodiment, the at least one connection material is arranged over the entire extent of the at least one protective layer.

According to one embodiment of the invention, it is provided that the flexible optoelectronic component is a flexible solar cell, having an electrode, a counterelectrode, and a layer system having at least one photoactive layer, wherein the layer system is arranged between the two electrodes and wherein the at least one busbar is electrically conductively contacted at least partly at the electrode and/or the counterelectrode.

According to one embodiment of the invention, it is provided that a first busbar electrically conductively contacts at least one electrode and a second busbar electrically conductively contacts at least one counterelectrode, wherein the first busbar leads to a first electrically conductive element and the second busbar leads to a second electrically conductive element, wherein preferably the two electrically conductive elements are electrically conductively connected to the junction box.

In one preferred embodiment, the junction box is arranged on a region at a distance from an edge of the optoelectronic component. In one alternatively preferred embodiment, the junction box is arranged on an edge of the at least one protective layer and/or the encapsulation of the optoelectronic component.

In one preferred embodiment, the junction box is arranged on the front side of the solar cell, in particular on a region on an edge of the solar cell. In one alternative embodiment of the invention, the junction box is arranged on the front side of the solar cell, in particular on a region at a distance from the layer system of the optoelectronic component.

In one preferred embodiment, the junction box is arranged on the side of the solar cell facing the sun as intended. In one alternatively preferred embodiment, the junction box is arranged on the side of the solar cell facing away from the sun as intended.

In one preferred embodiment, the electrically conductive element electrically conductively connects at least two busbars, preferably busbars of different cells, and leads them to the junction box.

According to one embodiment of the invention, it is provided that the junction box is arranged on a side of the optoelectronic component, preferably of a solar cell, that faces the sun, and the electrically conductive element is arranged on a side of the optoelectronic component, preferably of a solar cell, that faces away from the sun as intended.

The invention is explained in greater detail below with reference to the drawings, in which:

FIG. 1 shows a schematic illustration of one exemplary embodiment of a method for electrically conductively contacting an optoelectronic component 10 having at least one protective layer 7, in a flow diagram. The optoelectronic component 10, in particular a photovoltaic element, comprises at least one electrode 6, a counterelectrode 5, and a layer system 4 having at least one photoactive layer, wherein the layer system 4 is arranged between the two electrodes 5, 6 and wherein the at least one busbar 1 is electrically conductively contacted at least partly at the electrode 6 and/or the counterelectrode 5.

The method for electrically conductively contacting the optoelectronic component 10 having at least one protective layer 7, in particular a flexible optoelectronic component 10, comprises the following method steps: a) providing the optoelectronic component 10 having the at least one protective layer 7, wherein the optoelectronic component 10 has at least one busbar 1 arranged below the at least one protective layer 7, b) forming at least one opening 8 by means of laser ablation using at least one laser beam in the at least one protective layer 7, wherein the wavelength range of the laser is 8 μm to 12 μm, wherein at least one busbar 1 arranged below the at least one protective layer 7 is partly exposed, such that the at least one busbar 1 is not damaged, c) introducing a low-melting solder into the at least one opening 8 of the at least one protective layer 7, and aligning and fixing a flexible electrically conductive element 2 on a side of the at least one opening 8 opposite the at least one busbar 1, and d) forming, by means of inductive soldering with a uniform heat input, an electrically conductive connection element 11 in the at least one opening 8, such that the electrically conductive element 2 and the at least one busbar 1 are electrically conductively contacted via the at least one connection element 11.

As a result, a simple and reliable electrically conductive contacting is ensured. Furthermore, damage to the sensitive layer system and/or the electrodes is avoided. Advantageously, the busbars, in particular the busbars embodied as thin metal layers, and the electrically conductive connection material arranged between the electrode and/or the counterelectrode and the at least one busbar are not damaged. Advantageously, the heat input is limited temporally as well as thermally, thereby avoiding damage to the adjoining layer system. Advantageously, a plurality of connection elements, in particular a plurality of busbars, can be connected via an electrically conductive contacting. Advantageously, the method is implementable in a roll-to-roll process.

The parameters of the laser ablation, in particular an energy density, a pulse duration a pulse shape, a pulse frequency and/or a wavelength of the at least one laser beam, are set depending on the material and the layer thickness of the at least one protective layer 7 in such a way that the laser ablation of the protective layer 7 ensures the removal of the protective layer 7 in order to expose the busbar 1 without damage to the at least one busbar and the layer system 4.

The parameters of the inductive soldering are set depending on the material and dimensions of the connection element 11 to be formed in such a way that the inductive soldering ensures the formation of the connection element 11 for electrically conductively contacting the at least one busbar 1 and the electrically conductive element 2, and in the process does not damage the at least one busbar 1 and the layer system 4.

In one configuration of the invention, the electrode 6, the counterelectrode 5 and the layer system 4 are laser-structured, such that the electrode 6 and/or the counterelectrode 5 are/is electrically conductively contactable with the at least one busbar 1 in each case from a side of the optoelectronic component 10 facing away from the sun as intended or in each case from a side of said optoelectronic component facing the sun as intended. This enables in particular the electrically conductive contacting of different potentials on one plane of the optoelectronic component 10, in particular a plane parallel to the extent of the layer system 4 via at least one busbar 1. In one configuration of the invention, two busbars 1 are arranged at the electrode 6 and/or the counterelectrode 5.

In one configuration of the invention, after step d) the at least one electrically conductive element 2 is electrically conductively connected to a junction box 3, wherein the junction box 3 is arranged on the optoelectronic component 10, preferably on a region at a distance from a corner of the optoelectronic component 10.

In a further configuration of the invention, the laser medium of the at least one laser beam in step b) is CO2.

In a further configuration of the invention, in step c) a solder preform is introduced into the at least one opening 8.

In a further configuration of the invention, the at least one opening 8 has a cross-sectional area of 0.1 to 75 mm2, preferably of 1 to 30 mm2, wherein preferably a contact area of the connection element 11 with the at least one busbar 1 and/or with the electrically conductive element 2 is smaller than the area of the at least one busbar 1 facing the connection element 11.

In a further configuration of the invention, the cross-sectional area of the at least one opening corresponds to the cross-sectional area of the connection element.

In a further configuration of the invention, the low-melting solder for forming the connection element 11 is selected from the group consisting of bismuth, copper, silver and tin, and an alloy of at least one of these elements.

Figure 2:
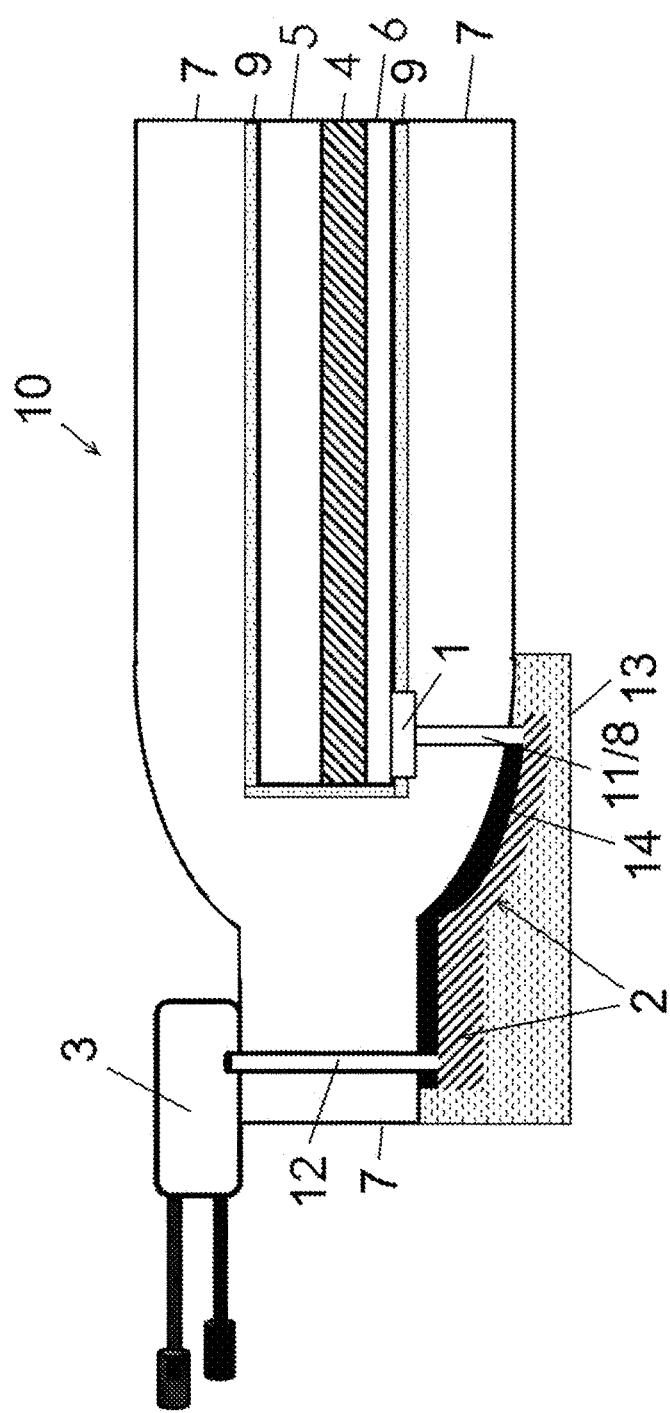
FIG. 2 shows a schematic illustration of one exemplary embodiment of an optoelectronic component having a protective layer with an electrically conductive contacting, in a side view.

In a further configuration of the invention, at least one connection material 9, preferably an adhesive, is arranged between the at least one protective layer 7 and the at least one busbar 1, wherein in step b) the at least one opening 8 is formed in the at least one protective layer 7 and in the connection material 9 arranged on the at least one protective layer 7. The connection material 9 illustrated in FIG. 2 is additionally embodied alternatively.

In a further configuration of the invention, the electrically conductive element 2 is embodied as a plate or a strip, wherein the plate or the strip preferably has a layer thickness of 10 µm to 100 µm, preferably of 10 µm to 60 µm, or is embodied as a wire, wherein the wire preferably has a cross-sectional area of 0.1 mm2 to 2 mm2, preferably of 0.5 mm2 to 1 mm2.

In a further configuration of the invention, the at least one busbar 1 is embodied as a metal layer composed of at least one metal or an alloy thereof, preferably composed of copper and tin, wherein preferably the at least one busbar 1 and the electrically conductive element 2 are embodied from the same material.

In a further configuration of the invention, after step d) the electrically conductive element 2 is at least regionally outwardly coated with an insulating layer 13.

In a further configuration of the invention, for the purpose of electrically conductively connecting the junction box 3 to the electrically conductive element 2 of the optoelectronic component 10 having at least one protective layer 7, after step d), in a step e) at least one connecting opening is formed by means of laser ablation using at least one laser beam in the at least one protective layer 7, preferably from that side of the optoelectronic component 10 having the at least one protective layer 7 which faces the sun as intended, with the electrically conductive element 2 obtained in step d), wherein the wavelength range of the laser is 8 µm to 12 µm, wherein the electrically conductive element 2 arranged behind the at least one protective layer 7 on the side facing away from the sun as intended is at least partly exposed, such that the electrically conductive element 2 is not damaged.

In a further configuration of the invention, in a step f) a solder is introduced into the at least one connecting opening of the at least one protective layer 7 formed in step e), and the junction box 3 is aligned and fixed on a side of the at least one connecting opening opposite the electrically conductive element 2, and in a step g) by means of inductive soldering an electrically conductive connecting element 12 is formed in the at least one connecting opening, such that the electrically conductive element 2 and the junction box 3 are electrically conductively contacted via the at least one connecting element 12.

In a further configuration of the invention, the method is used for electrically conductively contacting an optoelectronic component 10 in a roll-to-roll process.

FIG. 2 shows a schematic illustration of one exemplary embodiment of an optoelectronic component 10 having a protective layer 7 with an electrically conductive contacting, in a side view. Identical and functionally identical elements are provided with the same reference signs, and so in this respect reference is made to the description above. The optoelectronic component 10, in particular a flexible optoelectronic component 10, has at least one protective layer 7 and at least one busbar 1 arranged below the at least one protective layer 7 of the optoelectronic component 10. Furthermore, the optoelectronic component 10 has at least one electrically conductive contacting, in particular produced according to a method according to the invention, for electrically conductively contacting the optoelectronic component 10 having at least one protective layer 7, wherein the at least one electrically conductive contacting electrically conductively contacts the at least one busbar 1 with a flexible electrically conductive element 2 by means of an electrically conductive connection element 11.

In one configuration of the invention, the at least one electrically conductive element 2 is electrically conductively connected to a junction box 3, wherein the junction box 3 is arranged on the optoelectronic component 10.

In one configuration of the invention, the junction box 3 is arranged on a region at a distance from a corner of the optoelectronic component 10.

In a further configuration of the invention, at least one connection material 9, preferably an adhesive, is arranged between the at least one protective layer 7 and the at least one busbar 1.

In a further configuration of the invention, there is arranged between the at least one protective layer 7 and the electrically conductive element 2 at least partly a functional layer 14, preferably a color layer, a filter layer and/or an adhesive layer.

In a further configuration of the invention, the flexible optoelectronic component 10 is a flexible solar cell, and comprises an electrode 6, a counterelectrode 5, and a layer system 4 having at least one photoactive layer, wherein the layer system 4 is arranged between the two electrodes 5, 6 and wherein the at least one busbar 1 is electrically conductively contacted at least partly at the electrode 6 and/or the counterelectrode 5. The two electrodes 5, 6 and the layer system 4 arranged therebetween constitute the basic construction of a solar cell. The layer system 4 can be embodied in different ways, in particular can comprise a different number of absorber materials and/or a different number of photoactive layers. The production of the optoelectronic component 10, in particular of a photovoltaic element having a layer system 4, can be carried out by evaporation in a vacuum, with or without a carrier gas, or processing from a solution or suspension, such as in the case of coating or printing, for example. Individual layers can likewise be applied by sputtering. Preference is given to producing the layers by evaporating the small molecules in a vacuum.

In a further configuration of the invention, a first busbar 1 electrically conductively contacts the at least one electrode 6 and a second busbar 15 electrically conductively contacts the at least one counterelectrode 5, wherein the first busbar 1 leads to a first electrically conductive element 2 and the second busbar 15 leads to a second electrically conductive element 16, and wherein preferably the two electrically conductive elements 2, 16 are electrically conductively connected to the junction box 3.

In the present exemplary embodiment, the optoelectronic component 10 is a flexible optoelectronic component 10, in particular a flexible solar cell. The flexible solar cell is in particular an organic solar cell having at least one photoactive layer based on small molecules; however, the use of other flexible organic solar cells is also conceivable.

In a further configuration of the invention, the junction box 3 is arranged on a side of the optoelectronic component 10, preferably of a solar cell, that faces the sun as intended, and the electrically conductive element 2 is arranged on a side of the optoelectronic component 10, preferably of a solar cell, that faces away from the sun as intended.

In a further configuration of the invention, there can be arranged between the at least one protective layer 7 and the electrically conductive element 2 at least partly a functional layer 14, preferably a color layer, a filter layer and/or an adhesive layer.

Figure 3A:
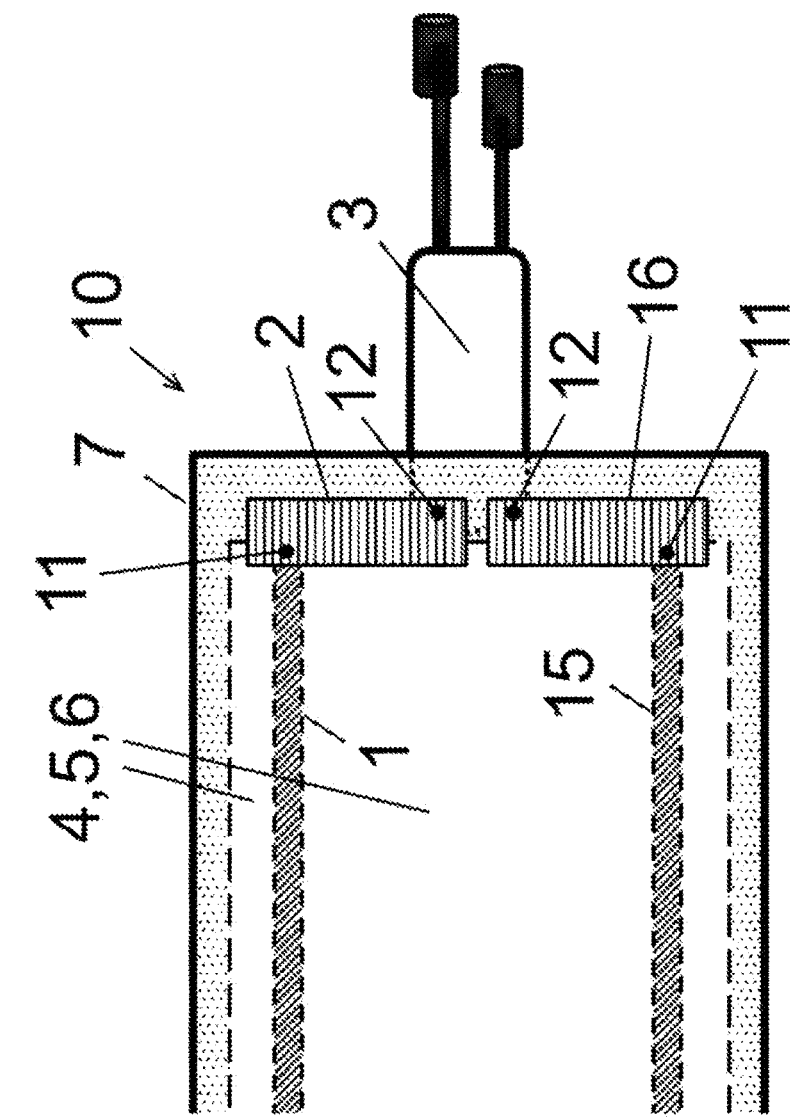
FIG. 3A and FIG. 3B show schematic illustrations of two exemplary embodiments of an optoelectronic component having a protective layer with an electrically conductive contacting, in a plan view.
Figure 3B:
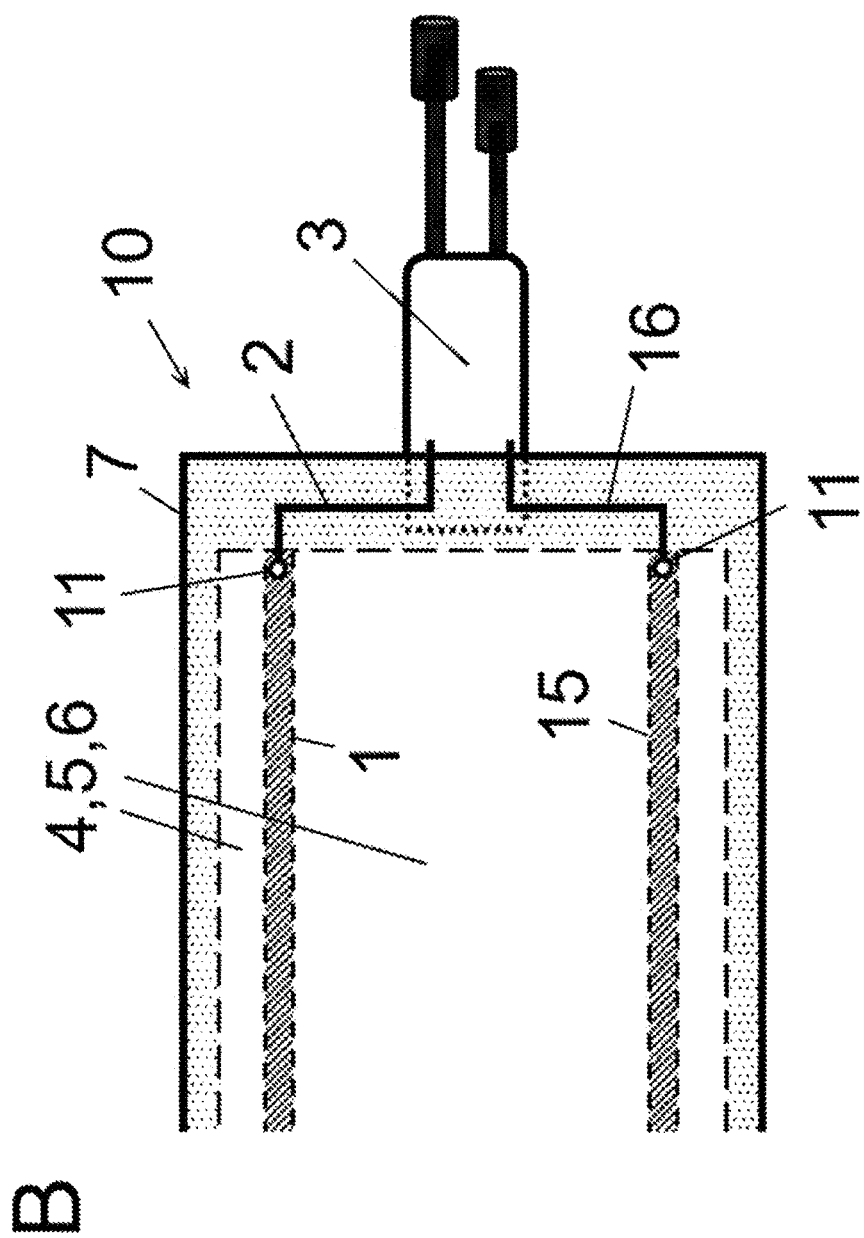

FIG. 3 shows schematic illustrations of two exemplary embodiments of an optoelectronic component 10 having a protective layer 7 with an electrically conductive contacting, in a plan view. Identical and functionally identical elements are provided with the same reference signs, and so in this respect reference is made to the description above.

In these exemplary embodiments, two busbars 1, 15 are arranged on an electrode 6 and/or a counterelectrode 5, wherein a first busbar 1 is assigned to a first potential and a second busbar 15 is assigned to a second potential. The electrode 6, the counterelectrode 5 and the layer system 4 are laser-structured, wherein the electrode 6 and/or the counterelectrode 5 are/is electrically conductively contacted with the busbars 1, 15 in each case from a side of the optoelectronic component 10 facing away from the sun as intended or in each case from a side of said optoelectronic component facing the sun as intended.

In the first exemplary embodiment (FIG. 3A), two electrically conductive contactings are present, which are produced according to a method according to the invention for electrically conductively contacting the optoelectronic component 10 having the at least one protective layer 7 in accordance with steps a) to d). In this case, the busbar 1 is electrically conductively connected to an electrically conductive element 2 via a connection element 11 and the busbar 15 is electrically conductively connected to an electrically conductive element 16 via a connection element 11. In one configuration of the invention, the electrically conductive elements 2, 16 are at least regionally outwardly coated with an insulating layer 13. Furthermore, for the purpose of electrically conductively connecting the junction box 3 to the electrically conductive elements 2, 16, two connecting openings are formed by means of laser ablation using at least one laser beam in the at least one protective layer 7, preferably from that side of the optoelectronic component 10 having the at least one protective layer which faces the sun as intended, in accordance with step e), wherein the wavelength range of the laser is 8 µm to 12 µm. The electrically conductive elements 2, 16 arranged behind the at least one protective layer 7 on the side facing away from the sun as intended are thereby partly exposed, such that the electrically conductive elements 2, 16 are not damaged. Into the two connecting openings of the at least one protective layer 7, in accordance with steps f) and g), electrically conductive connecting elements 12 are formed in the two connecting openings, such that the electrically conductive elements 2, 16 and the junction box 3 are electrically conductively contacted via the two connecting elements 12. The junction box 3 is situated partly behind the at least one protective layer 7, as seen in the plan view.

In the second exemplary embodiment (FIG. 3B), two electrically conductive contactings are present, which are produced according to a method according to the invention for electrically conductively contacting the optoelectronic component 10 having the at least one protective layer 7 in accordance with steps a) to d). In this case, the busbar 1 is electrically conductively connected to an electrically conductive element 2 via a connection element 11 and the busbar 15 is electrically conductively connected to an electrically conductive element 16 via a connection element 11. In one configuration of the invention, the electrically conductive elements 2, 16 are at least regionally outwardly coated with an insulating layer 13. The electrically conductive elements 2, 16 are embodied in the form of a wire or a narrow strip, are led on the surface of the optoelectronic component 10 to a junction box 3, and are electrically conductively connected to the junction box 3.

In one configuration of the invention, the electrically conductive elements 2, 16 are at least regionally outwardly coated with an insulating layer 13. The electrically conductive elements 2, 16 are led to the junction box 3 on the side of the optoelectronic component 10 facing away from the sun as intended. Alternatively, it is also conceivable for the electrically conductive elements 2, 16, in accordance with steps e) to g), to be led through an edge region of the at least one protective layer 7, in particular a region on which no layer system 4 is arranged, to the side of the optoelectronic component 10 facing the sun as intended and/or to be electrically conductively connected there to the junction box 3. The junction box 3 is situated partly behind the at least one protective layer 7 as seen in the plan view.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for electrically conductively contacting an optoelectronic component having at least one protective layer, comprising:
   a) providing the optoelectronic component having the at least one protective layer, wherein the optoelectronic component has at least one busbar arranged below the at least one protective layer,
   b) forming at least one opening in the at least one protective layer on a side of the optoelectronic component configured to face away from the sun, wherein the at least one opening is formed by laser ablation using at least one laser beam in the at least one protective layer, wherein the wavelength range of the laser is 8 µm to 12 µm, wherein at least one busbar arranged below the at least one protective layer is partly exposed, such that the at least one busbar is not damaged,
   c) introducing a low-melting solder into the at least one opening of the at least one protective layer, and aligning and fixing an electrically conductive element that is flexible on a side of the at least one opening opposite the at least one busbar,
   d) forming, by inductive soldering with a uniform heat input, an electrically conductive connection element in the at least one opening, such that the electrically conductive element and the at least one busbar are electrically conductively contacted via the at least one connection element, wherein the low-melting solder for forming the connection element is selected from the group consisting of bismuth, copper, silver, tin, and an alloy of at least one of these elements e) forming at least one connecting opening in the at least one protective layer from a side of the optoelectronic component configured to face the sun, the at least one connecting opening being formed by laser ablation using at least one further laser beam having a wavelength range of 8 μm to 12 μm, wherein the electrically conductive element is arranged behind the at least one protective layer on the side of the optoelectronic component configured to face away from the sun, and wherein the electrically conductive element is partly exposed such that the electrically conductive element is not damaged, f) introducing solder into the at least one connecting opening formed in step e) and aligning and fixing a junction box on a side of the at least one connecting opening opposite the electrically conductive element, and g) forming at least one electrically conductive connecting element by inductive soldering in the at least one connecting opening such that the electrically conductive element and the junction box are electrically conductively contacted via the at least one electrically conductive connecting element.

2. The method as claimed in claim 1, wherein the at least one electrically conductive element is electrically conductively connected to the junction box after step d), and wherein the junction box is arranged on the optoelectronic component on a region at a distance from a corner of the optoelectronic component.

3. The method as claimed in claim 1, wherein the laser medium of the at least one laser beam in step b) is CO2.

4. The method as claimed in claim 1, wherein the at least one opening has a cross-sectional area of 0.1 mm2 to 75 mm2, wherein a contact area of the connection element with the at least one busbar and/or with the electrically conductive element is smaller than the area of the at least one busbar facing the connection element.

5. The method as claimed in claim 1, wherein at least one connection material is arranged between the at least one protective layer and the at least one busbar, and wherein in step b) the at least one opening is formed in the at least one protective layer and in the connection material arranged on the at least one protective layer.

6. The method as claimed in claim 1, wherein the electrically conductive element is a plate having a layer thickness of 10 μm to 100 μm.

7. The method as claimed in claim 1, wherein the at least one busbar is composed of at least one metal or an alloy thereof, and wherein the at least one busbar and the electrically conductive element comprise the same material.

8. The method as claimed in claim 1, further comprising performing a roll-to-roll process.

9. An optoelectronic component that is flexible, having at least one protective layer and having at least one busbar arranged below the at least one protective layer of the optoelectronic component, wherein the optoelectronic component has at least one electrically conductive contact produced according to claim 1, wherein the at least one electrically conductive contact electrically conductively contacts the at least one busbar to a flexible electrically conductive element by an electrically conductive connection element, and wherein the optoelectronic component is electrically conductively connected to a junction box.

10. The optoelectronic component as claimed in claim 9, wherein at least one connection material comprising an adhesive is arranged between the at least one protective layer and the at least one busbar.

11. The optoelectronic component as claimed in claim 9, wherein the optoelectronic component is a flexible solar cell having an electrode, a counterelectrode, and a layer system having at least one photoactive layer, wherein the layer system is arranged between the electrode and counterelectrode and wherein the at least one busbar is electrically conductively contacted at least partly at the electrode and/or the counterelectrode.

12. The optoelectronic component as claimed in claim 11, wherein a first busbar electrically conductively contacts the electrode and a second busbar electrically conductively contacts the counterelectrode, wherein the first busbar leads to a first electrically conductive element and the second busbar leads to a second electrically conductive element, and wherein the first and second electrically conductive elements are electrically conductively connected to the junction box.

13. The optoelectronic component as claimed in claim 9, wherein the junction box is arranged on a side of the optoelectronic component that faces the sun and the flexible electrically conductive element is arranged on a side of the optoelectronic component that faces away from the sun.

14. The method as claimed in claim 1, wherein the electrically conductive element is embodied as a strip, wherein the strip has a layer thickness of 10 μm to 100 μm or is embodied as a wire with a cross-sectional area of 0.1 mm2 to 2 mm2.

15. The method as claimed in claim 1, wherein a solder preform is introduced into the at least one opening in step c), the solder preform being formed from the low-melting solder.

16. The method as claimed in claim 1, wherein the connection element extends entirely through the at least one protective layer from the at least one busbar to the conductive element, and wherein the connection element is formed from the low-melting solder.

17. The method as claimed in claim 16, wherein the connecting element extends entirely through the at least one protective layer from the junction box to the conductive element.

18. The method as claimed in claim 17, wherein the connecting element is formed from the solder introduced into the at least one connecting opening in step f).

* * * * *